US006611459B2

United States Patent
Shiromoto et al.

(10) Patent No.: US 6,611,459 B2
(45) Date of Patent: Aug. 26, 2003

(54) NON-VOLATILE SEMICONDUCTOR MEMORY DEVICE

(75) Inventors: Tatsuya Shiromoto, Tokyo (JP); Natsuo Ajika, Tokyo (JP); Satoshi Shimizu, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/164,625

(22) Filed: Jun. 10, 2002

(65) Prior Publication Data
US 2003/0128584 A1 Jul. 10, 2003

(30) Foreign Application Priority Data

Jan. 7, 2002 (JP) ........................................ 2002-000322

(51) Int. Cl.⁷ ............................................... G11C 16/04
(52) U.S. Cl. .............................. 365/185.11; 365/185.33; 365/63
(58) Field of Search ....................... 365/185.11, 185.33, 365/185.01, 63, 51

(56) References Cited

U.S. PATENT DOCUMENTS 5,756,385 A * 5/1998 Yuan et al. ................. 438/258
6,166,953 A * 12/2000 Matsubara et al. ..... 365/185.11

* cited by examiner

Primary Examiner—Vu A. Le
(74) Attorney, Agent, or Firm—Oblon, Spivak, McClelland, Maier & Neustadt, P.C.

(57) ABSTRACT

A non-volatile semiconductor memory device usable in relatively wide applications and a method of manufacturing the same are provided. A NOR-type flash memory region (2) including a NOR-type memory cell transistor and a DINOR-type flash memory region (3) including a DINOR-type memory cell transistor are manufactured into a single semiconductor chip (1). A peripheral circuit region (7) including a transistor for a peripheral circuit or the like is manufactured into a region surrounding the NOR-type flash memory region (2) and the DINOR-type flash memory region (3). The peripheral circuit region (7) is shareable between the NOR-type flash memory region (2) and the DINOR-type flash memory region (3) by electrical connection to both of the regions.

6 Claims, 20 Drawing Sheets

F I G . 3 5
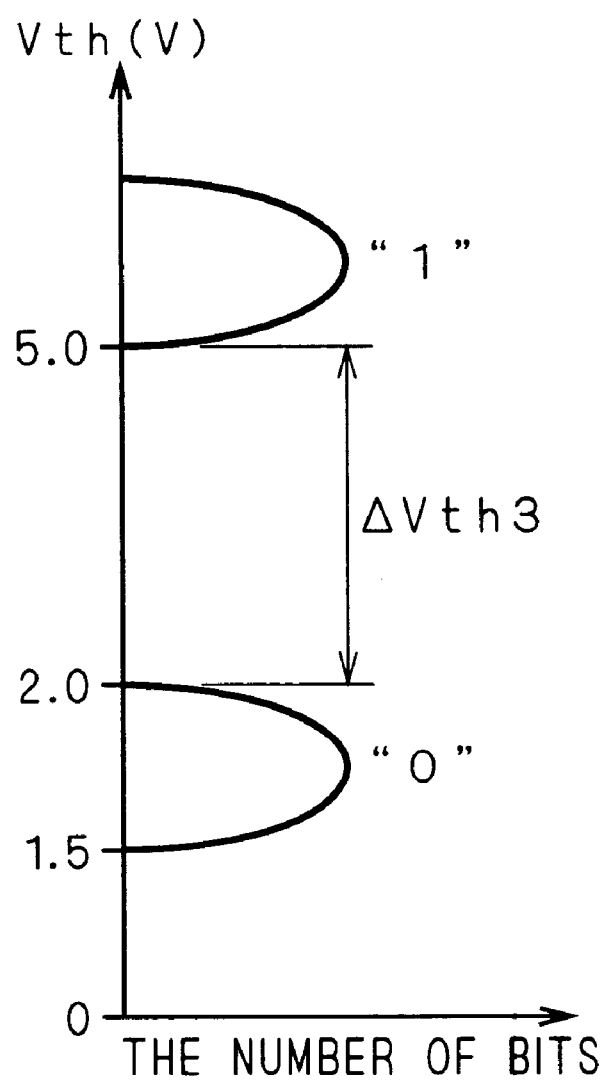

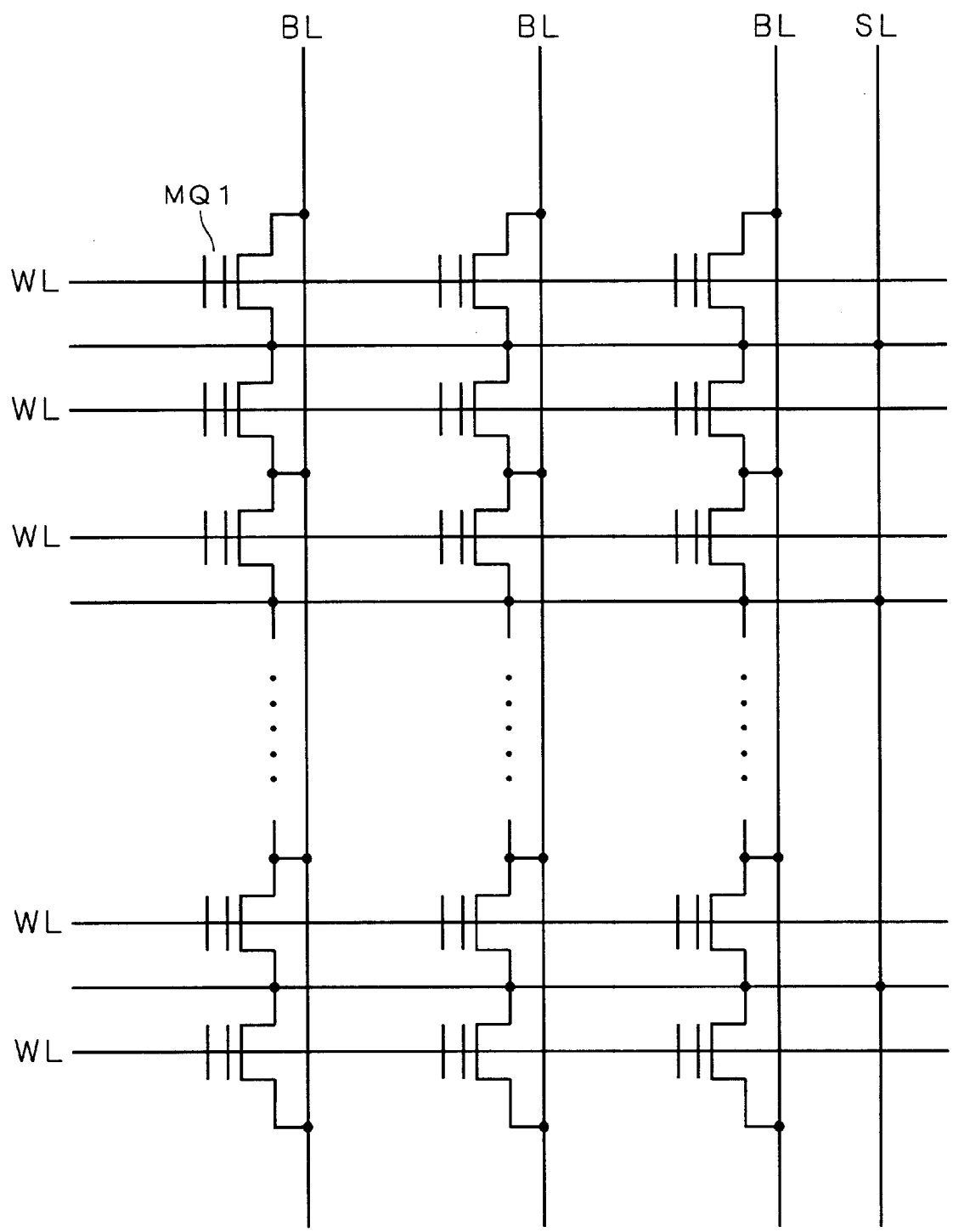
F I G . 3 6

NON-VOLATILE SEMICONDUCTOR MEMORY DEVICE

BACKGROUND OF THE INVENTION

1. Field of the Invention

The present invention relates to a non-volatile semiconductor memory device improved in its limited applications.

2. Description of the Background Art

A flash memory capable of erasing an entire memory array at one time (i.e., in a flash) is one of the non-volatile semiconductor memory devices. Flash memories have NOR-type, new-NOR-type and DINOR-type memory cell transistor structures.

FIG. 24 illustrates a program (write) operation of a NOR-type memory cell transistor. FIG. 25 illustrates an erase operation of the NOR-type memory cell transistor. FIG. 26 illustrates a read operation of the NOR-type memory cell transistor. The memory cell transistor shown in FIGS. 24 through 26 has an NMOS structure.

The NOR-type memory cell transistor shown in FIGS. 24 through 26 includes a source main region 41 and a drain region 31 both selectively formed in a surface of a semiconductor substrate 11. A source diffusion region 42 having an impurity concentration lower than that of the source main region 41 is formed around the source main region 41. A floating gate electrode 24 is formed on a portion of the semiconductor substrate 11 lying between the source main region 41 and the drain region 31, with a tunnel oxide film 13 disposed between the semiconductor substrate 11 and the floating gate electrode 24. A control gate electrode 23 is formed on the floating gate electrode 24, with an intergate oxide film 16 therebetween.

A source terminal P1, a drain terminal P2, a gate terminal P3 and a substrate terminal P4 are provided for setting the potential of the source main region 41, the drain region 31, the control gate electrode 23 and the semiconductor substrate 11, respectively.

With such an arrangement, the program operation of the NOR-type memory cell transistor is performed by setting the source terminal P1 at 0 V, the drain terminal P2 at a positive high voltage HV, the gate terminal P3 at the positive high voltage HV, and the substrate terminal P4 at 0 V, as shown in FIG. 24. The above settings cause electrons to be injected into the floating gate electrode 24 because of a channel hot electron phenomenon, whereby the program operation (or the operation of setting the NOR-type memory cell transistor at a high Vth (high threshold voltage)) is performed.

The erase operation of the NOR-type memory cell transistor is performed by setting the source terminal P1 at the positive high voltage HV, rendering the drain terminal P2 floating (or open), setting the gate terminal P3 at 0 V or at a negative high voltage MHV, and setting the substrate terminal P4 at 0 V, as shown in FIG. 25. The above settings cause electrons to be extracted from the floating gate electrode 24 because of an FN (Fowler-Nordheim tunneling) phenomenon near an edge of the source main region 41, whereby the erase operation (or the operation of setting the NOR-type memory cell transistor at a low Vth (low threshold voltage)) is performed.

The read operation of the NOR-type memory cell transistor is performed by setting the source terminal P1 at 0 V, the drain terminal P2 at a positive low voltage HLow, the gate terminal P3 at a read voltage VR (where low Vth<VR<high Vth), and the substrate terminal P4 at 0 V, as shown in FIG. 26. The above settings allow detection of whether or not the memory cell transistor enters the on state to identify whether the threshold voltage is high Vth or low Vth, whereby the read operation is performed.

FIG. 27 is a graph showing a distribution of the threshold voltage Vth of the NOR-type memory cell transistor. As shown in FIG. 27, high Vth indicating "0" is distributed above 6.0 V, and low Vth indicating "1" is distributed between 1.5 V and 3.0 V. As a result, a threshold voltage window width $\Delta$Vth1 between the high Vth distribution and the low Vth distribution is 2.5 V.

FIG. 28 illustrates a program operation of a new-NOR-type memory cell transistor which is one type of the NOR-type memory cell transistor. FIG. 29 illustrates an erase operation of the new-NOR-type memory cell transistor. FIG. 30 illustrates a read operation of the new-NOR-type memory cell transistor. The memory cell transistor shown in FIGS. 28 through 30 has an NMOS structure.

The new-NOR-type memory cell transistor shown in FIGS. 28 through 30 includes a source region 45 and the drain region 31 both selectively formed in the surface of the semiconductor substrate 11. The floating gate electrode 24 is formed on a portion of the semiconductor substrate 11 lying between the source region 45 and the drain region 31, with the tunnel oxide film 13 disposed between the semiconductor substrate 11 and the floating gate electrode 24. The control gate electrode 23 is formed on the floating gate electrode 24, with the intergate oxide film 16 therebetween.

The source terminal P1, the drain terminal P2, the gate terminal P3 and the substrate terminal P4 are provided for setting the potential of the source region 45, the drain region 31, the control gate electrode 23 and the semiconductor substrate 11, respectively.

With such an arrangement, the program operation of the new-NOR-type memory cell transistor is performed by setting the source terminal P1 at 0 V, the drain terminal P2 at the positive high voltage HV, the gate terminal P3 at the positive high voltage HV, and the substrate terminal P4 at 0 V, as shown in FIG. 28. The above settings cause electrons to be injected into the floating gate electrode 24 because of the channel hot electron phenomenon, whereby the program operation is performed.

The erase operation of the new-NOR-type memory cell transistor is performed by setting the source terminal P1 at the positive high voltage HV, rendering the drain terminal P2 floating (or open), setting the gate terminal P3 at the negative high voltage MHV, and setting the substrate terminal P4 at the positive high voltage HV, as shown in FIG. 29. The above settings cause electrons to be extracted from the floating gate electrode 24 because of the FN phenomenon throughout the channel, whereby the erase operation is performed.

The read operation of the new-NOR-type memory cell transistor is performed by setting the source terminal P1 at 0 V, the drain terminal P2 at the positive low voltage HLow, the gate terminal P3 at the read voltage VR (where low Vth<VR<high Vth), and the substrate terminal P4 at 0 V, as shown in FIG. 30, in a similar manner to the NOR-type memory cell transistor.

FIG. 31 is a graph showing a distribution of the threshold voltage Vth of the new-NOR-type memory cell transistor. As shown in FIG. 31, high Vth indicating "0" is distributed above 6.0 V, and low Vth indicating "1" is distributed between 1.5 V and 3.0 V, as in the NOR-type memory cell transistor. As a result, a threshold voltage window width $\Delta$Vth2 between the high Vth distribution and the low Vth distribution is 2.5 V.

FIG. 32 illustrates a program operation of a DINOR-type memory cell transistor. FIG. 33 illustrates an erase operation of the DINOR-type memory cell transistor. FIG. 34 illustrates a read operation of the DINOR-type memory cell transistor. The memory cell transistor shown in FIGS. 32 through 34 has an NMOS structure.

The DINOR-type memory cell transistor shown in FIGS. 32 through 34 includes a source region 43 and a drain main region 32 both selectively formed in the surface of the semiconductor substrate 11. A drain diffusion region 33 having an impurity concentration lower than that of the drain main region 32 is formed around the drain main region 32. The floating gate electrode 24 is formed on a portion of the semiconductor substrate 11 lying between the source region 43 and the drain main region 32, with the tunnel oxide film 13 disposed between the semiconductor substrate 11 and the floating gate electrode 24. The control gate electrode 23 is formed on the floating gate electrode 24, with the intergate oxide film 16 therebetween.

The source terminal P1, the drain terminal P2, the gate terminal P3 and the substrate terminal P4 are provided for setting the potential of the source region 43, the drain main region 32, the control gate electrode 23 and the semiconductor substrate 11, respectively.

With such an arrangement, the program operation of the DINOR-type memory cell transistor is performed by rendering the source terminal P1 floating, setting the drain terminal P2 at the positive high voltage HV, setting the gate terminal P3 at the negative high voltage MHV, and setting the substrate terminal P4 at 0 V, as shown in FIG. 32. The above settings cause electrons to be extracted from the floating gate electrode 24 because of the FN phenomenon near an edge of the drain main region 32, whereby the program operation (or the operation of setting the DINOR-type memory cell transistor at low Vth) is performed.

The erase operation of the DINOR-type memory cell transistor is performed by setting the source terminal P1 at the negative high voltage MHV, rendering the drain terminal P2 floating (or open), setting the gate terminal P3 at the positive high voltage HV, and setting the substrate terminal P4 at the negative high voltage MHV, as shown in FIG. 33. The above settings cause electrons to be injected into the floating gate electrode 24 because of the FN phenomenon throughout the channel, whereby the erase operation (or the operation of setting the DINOR-type memory cell transistor at high Vth) is performed.

The read operation of the DINOR-type memory cell transistor is performed by setting the source terminal P1 at 0 V, the drain terminal P2 at the positive low voltage HLow, the gate terminal P3 at the read voltage VR (where low Vth<VR<high Vth), and the substrate terminal P4 at 0 V, as shown in FIG. 34, in a similar manner to the NOR-type and new-NOR-type memory cell transistors.

FIG. 35 is a graph showing a distribution of the threshold voltage Vth of the DINOR-type memory cell transistor. As shown in FIG. 35, high Vth indicating "1" is distributed above 5.0 V, and low Vth indicating "0" is distributed between 1.5 V and 2.0 V. As a result, a threshold voltage window width $\Delta Vth3$ between the high Vth distribution and the low Vth distribution is 3.0 V.

FIG. 36 is a circuit diagram showing an arrangement of a memory cell array of a NOR-type flash memory. As shown in FIG. 36, memory cell transistors MQ1 are arranged in a matrix such that the (control) gates of memory cell transistors MQ1 in each row are connected to the same word line WL, the drains of memory cell transistors MQ1 in each column are connected to the same bit line BL, and the sources of memory cell transistors MQ1 in each row are connected to the same source line SL while the sources of each pair of memory cell transistors MQ1 adjacent in a column direction are commonly connected. A new-NOR-type flash memory is similar in arrangement of the memory cell array of memory cell transistors to the NOR-type flash memory.

FIG. 37 is a circuit diagram showing an arrangement of a memory cell array of a DINOR-type flash memory. As shown in FIG. 37, memory cell transistors MQ2 are arranged in a matrix such that the gates of memory cell transistors MQ2 in each row are connected to the same word line WL, the drains of a predetermined number of memory cell transistors MQ2 in each column are connected to the source of a select transistor ST having a drain connected to a corresponding bit line BL, and the sources of memory cell transistors MQ2 in each row are connected to the same source line SL while the sources of each pair of memory cell transistors MQ2 adjacent in a column direction are commonly connected.

The above-mentioned NOR-type and new-NOR-type memory cell transistors have a relatively wide distribution of low Vth indicating "1", as shown in FIGS. 27 and 31. This leads to relatively narrow threshold voltage window widths $\Delta Vth1$ and $\Delta Vth2$ to create a need for setting the read voltage VR at about 3.0 (V)+$\alpha$ which is the maximum value of the low Vth distribution, resulting in difficulties in low voltage random access.

On the other hand, the DINOR-type memory cell transistor which is required to identify the write operation for each bit presents difficulties in high-speed write operation such as byte write.

Thus, the NOR-type and new-NOR-type memory cell transistors are not appropriate for low voltage random access applications, and the DINOR-type memory cell transistor is not appropriate for applications which require the high-speed write operation.

SUMMARY OF THE INVENTION

It is an object of the present invention to provide a non-volatile semiconductor memory device usable in relatively wide applications, and a method of manufacturing the same.

According to a first aspect of the present invention, the non-volatile semiconductor memory device includes a semiconductor substrate, a first non-volatile memory cell region, and a second non-volatile memory cell region.

The first non-volatile memory cell region is manufactured into the semiconductor substrate and is capable of non-volatile storage. The first non-volatile memory cell region includes a first memory cell transistor having a first operating characteristic in reading, writing and erase operations. The second non-volatile memory cell region is manufactured into the semiconductor substrate and is capable of non-volatile storage. The second non-volatile memory cell region includes a second memory cell transistor having a second operating characteristic different from the first operating characteristic in one of reading, writing and erase operations.

In the non-volatile semiconductor memory device, the regions in which the first and second memory cell transistors, respectively, having different operating characteristics are formed are provided on the single unit of semiconductor substrate. This non-volatile semiconductor memory device produces the effect of being usable in wide applications adaptable to applications of the first and second operating characteristics while ensuring a high level of integration.

Preferably, in the non-volatile semiconductor memory device, the first memory cell transistor includes a NOR-type memory cell transistor, and the second memory cell transistor includes a DINOR-type memory cell transistor.

The non-volatile semiconductor memory device can employ both the NOR-type memory cell transistor capable of high-speed write operation and the DINOR-type memory cell transistor capable of low voltage random access.

Preferably, in the non-volatile semiconductor memory device, the erase operation of the first memory cell transistor includes extracting an electron from a floating gate electrode constituting a memory cell into a surface of the semiconductor substrate serving as a channel region under the floating gate electrode.

The non-volatile semiconductor memory device can employ both the new-NOR-type memory cell transistor capable of high-speed write operation and the DINOR-type memory cell transistor capable of low voltage random access.

These and other objects, features, aspects and advantages of the present invention will become more apparent from the following detailed description of the present invention when taken in conjunction with the accompanying drawings.

BRIEF DESCRIPTION OF THE DRAWINGS

FIG. 35 is a graph showing a distribution of the threshold voltage of the DINOR-type memory cell MOS transistor;

FIG. 36 is a circuit diagram showing an arrangement of a memory cell array of a NOR-type flash memory.

DESCRIPTION OF THE PREFERRED EMBODIMENTS

<First Preferred Embodiment>

Figure 1:
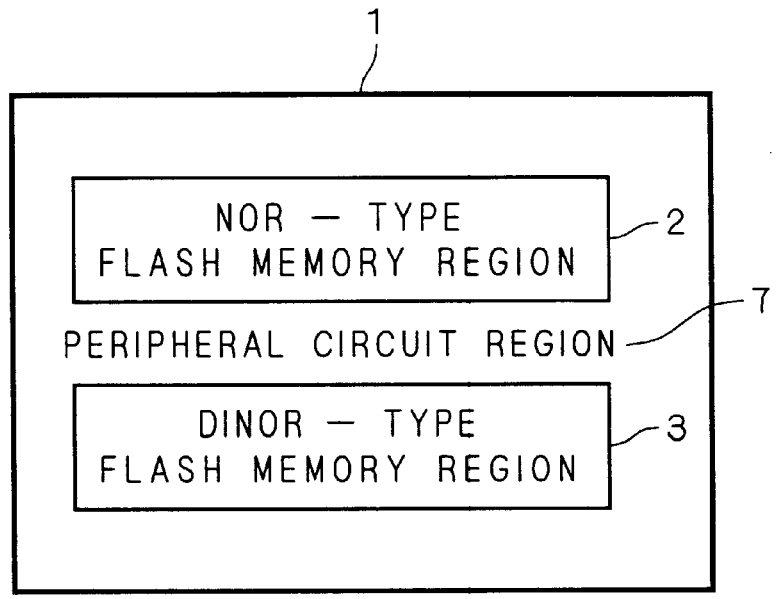
FIG. 1 illustrates a construction of a flash memory according to a first preferred embodiment of the present invention.

FIG. 1 illustrates a construction of a flash memory according to a first preferred embodiment of the present invention. As shown in FIG. 1, a NOR-type flash memory region 2 and a DINOR-type flash memory region 3 are manufactured into a single semiconductor chip 1. A NOR-type memory cell transistor is formed in the NOR-type flash memory region 2, and a DINOR-type memory cell transistor is formed in the DINOR-type flash memory region 3.

A peripheral circuit region 7 is manufactured into a region surrounding the NOR-type flash memory region 2 and the DINOR-type flash memory region 3. A transistor for a peripheral circuit or the like is formed in the peripheral circuit region 7, and is shareable between the NOR-type flash memory region 2 and the DINOR-type flash memory region 3 by electrical connection to both of the regions 2 and 3.

Elements such as (memory cell) transistors manufactured into each of the NOR-type flash memory region 2, the DINOR-type flash memory region 3 and the peripheral circuit region 7 are arranged in a regularly ordered array such as a gate array.

Figure 13:
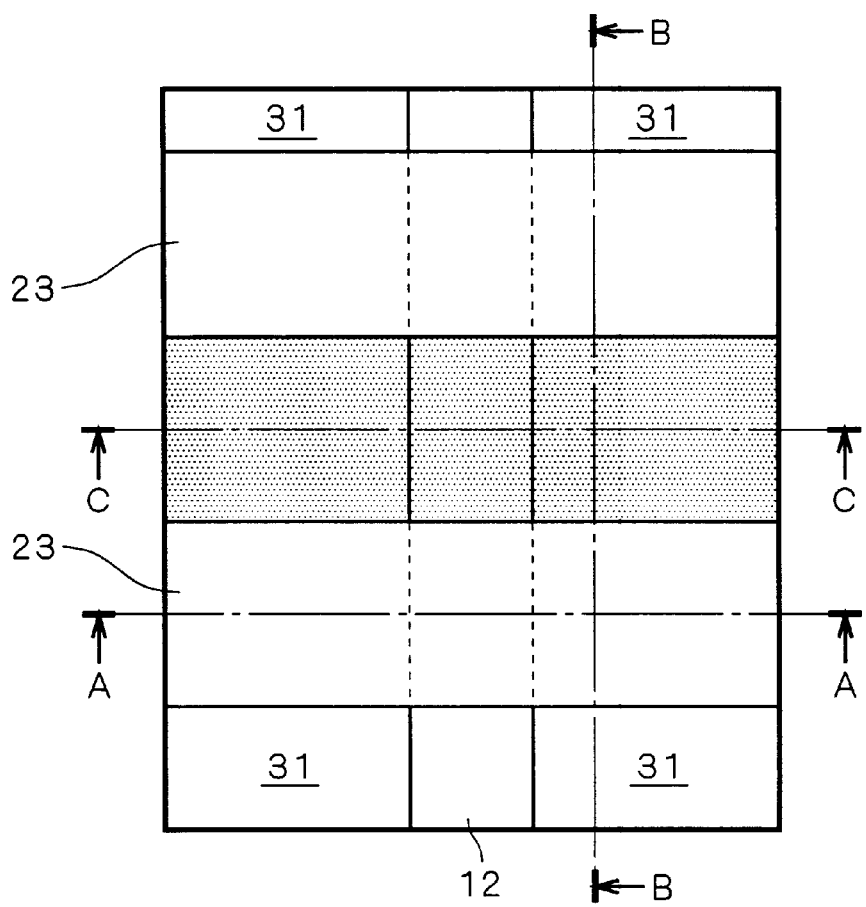
Figure 14:
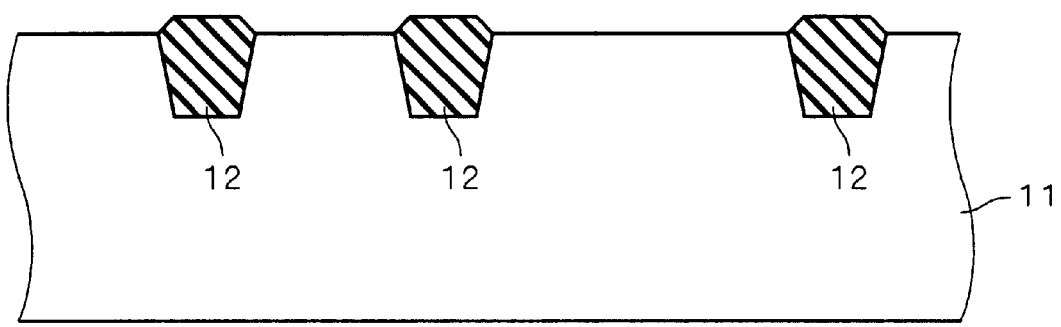

FIGS. 2 through 19 show a method of forming NOR-type and DINOR-type memory cell transistors in the flash memory according to the first preferred embodiment. FIGS. 2 through 12 and FIGS. 14 through 19 are sectional views, and FIG. 13 is a plan view. FIGS. 2, 4, 6 and 8 are sectional views taken along a word line WL, FIGS. 14 and 16 are sectional views taken along a region extending between word lines WL, and FIGS. 3, 5, 7, 9–12, 15, 17–19 are sectional views taken along a bit line BL. With reference to these figures, manufacturing steps according to the first preferred embodiment will be described.

Figure 2:
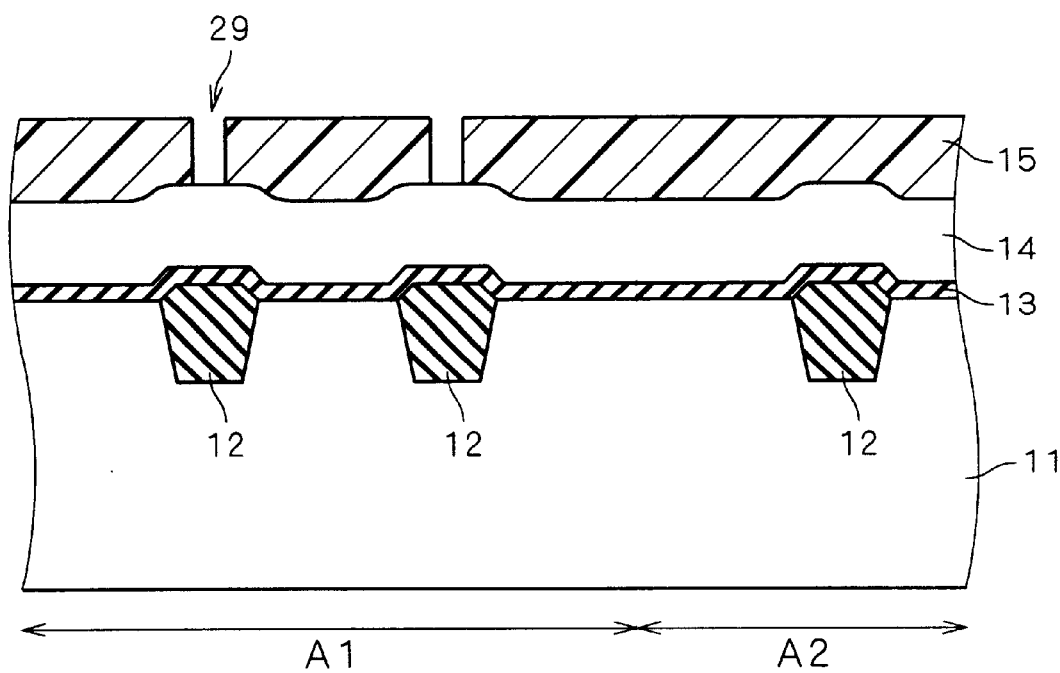
FIGS. 2 through 19 are sectional views showing a method of manufacturing memory cell transistors in the flash memory according to the first preferred embodiment.
Figure 3:
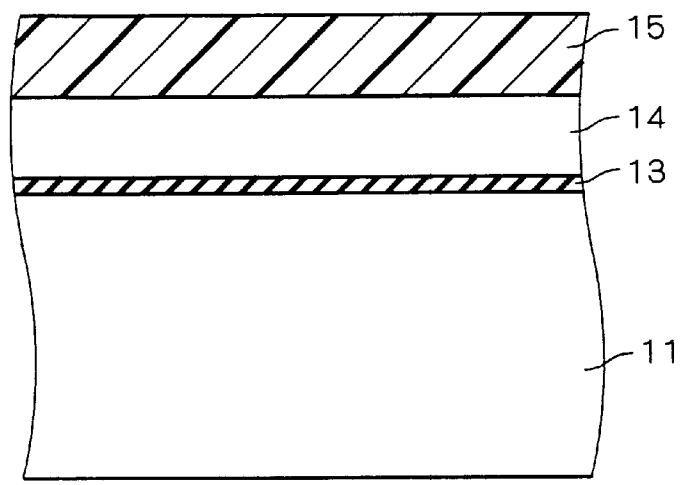

With reference to FIGS. 2 and 3, isolation films 12 are formed selectively in an upper layer portion of a semiconductor substrate 11, and islands (or well regions not shown) of a predetermined conductivity type are formed by ion implantation or the like. Thereafter, a tunnel oxide film 13 is deposited, and an amorphous Si layer 14 serving as a floating gate material is deposited. A resist 15 is formed which has openings 29 formed over the isolation films 12 in a memory cell region A1 and extending in a direction in which bit lines BL are to extend. The amorphous Si layer 14 and the tunnel oxide film 13 are selectively removed by using the resist 15 as a mask.

Figure 4:
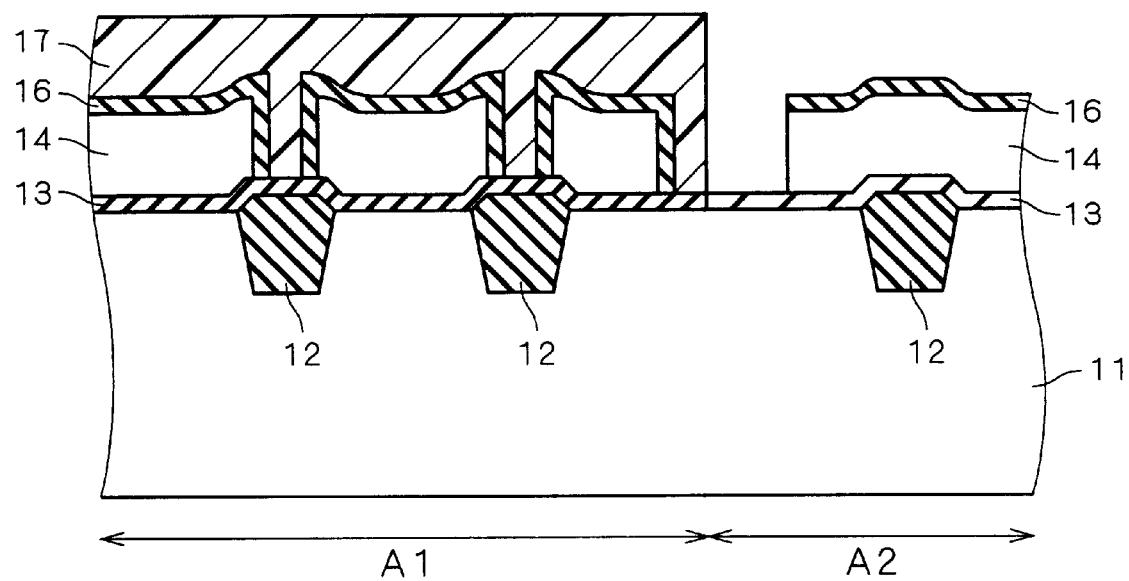
Figure 5:
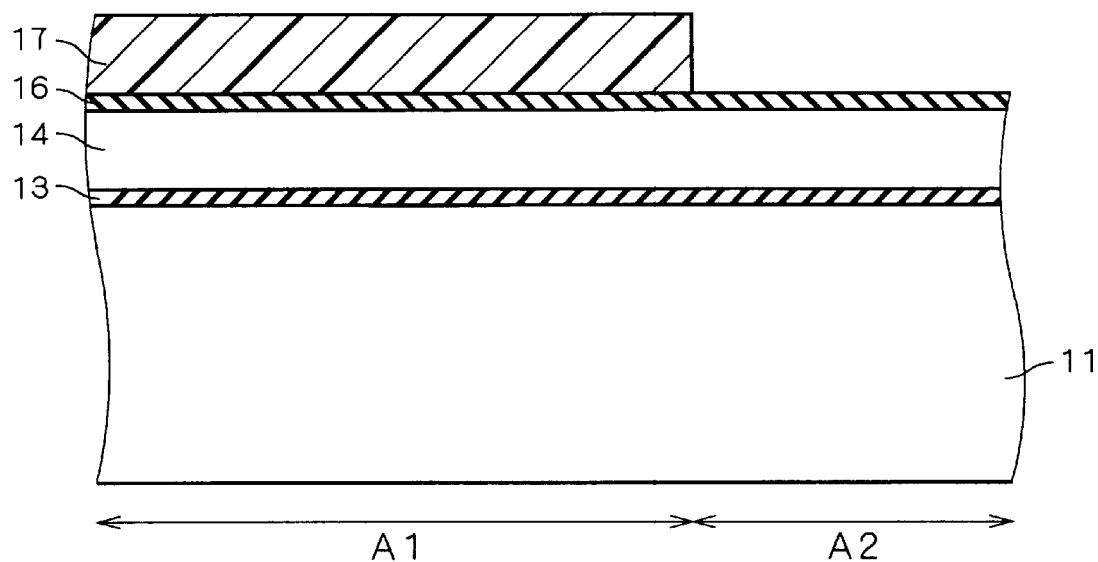

Next, referring to FIGS. 4 and 5, an intergate oxide film 16 is formed on the entire top surface of the resultant structure, and a resist 17 covering only the memory cell region A1 is formed. The tunnel oxide film 13, the amorphous Si layer 14 and the intergate oxide film 16 in a peripheral transistor region A2 are removed by using the resist 17 as a mask. Then, a gate oxide film 19 (not shown in FIGS. 4 and 5 but shown in FIG. 6 and its subsequent figures) for a transistor in a peripheral circuit of a memory cell is formed in the peripheral transistor region A2.

Figure 6:
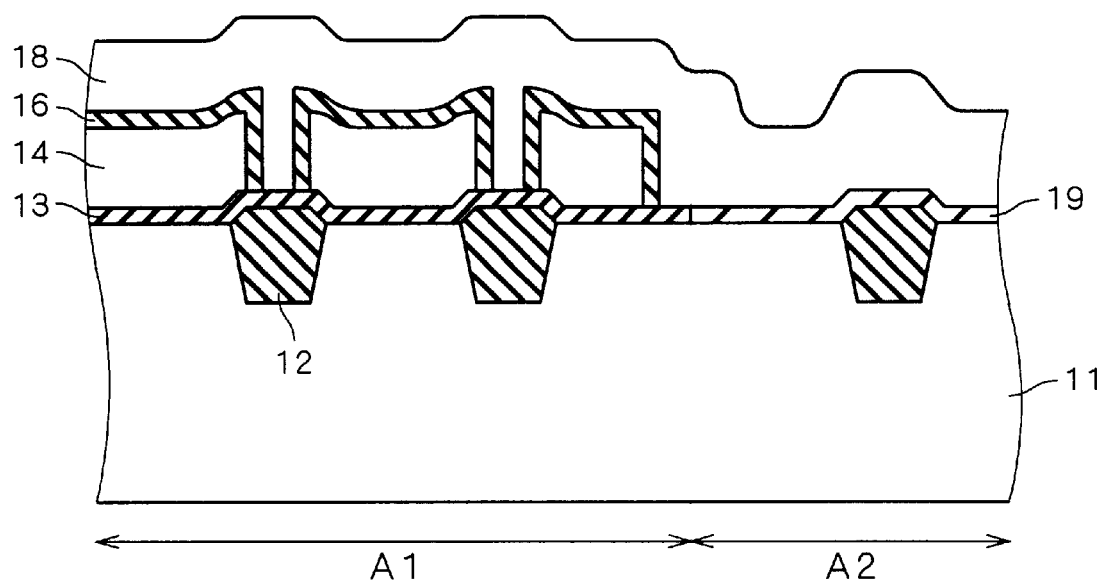
Figure 7:
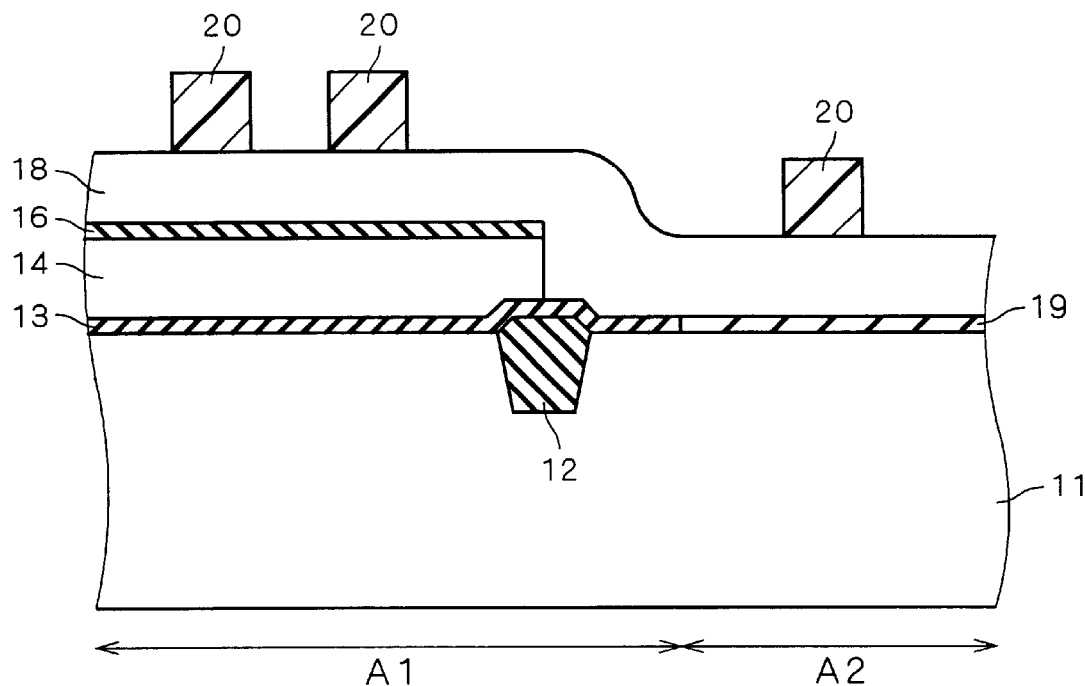

With reference to FIGS. 6 and 7, an amorphous Si layer 18 is formed on the entire top surface of the resultant structure, and a resist 20 is formed which covers a future control gate region in the memory cell region A1 and a future gate region in the peripheral transistor region A2. As shown in FIG. 6, the resist 20 is not formed on a portion of the amorphous Si layer 18 overlying a future word line WL region since this portion of the amorphous Si layer 18 is used as a control gate and the word line WL.

Figure 9:
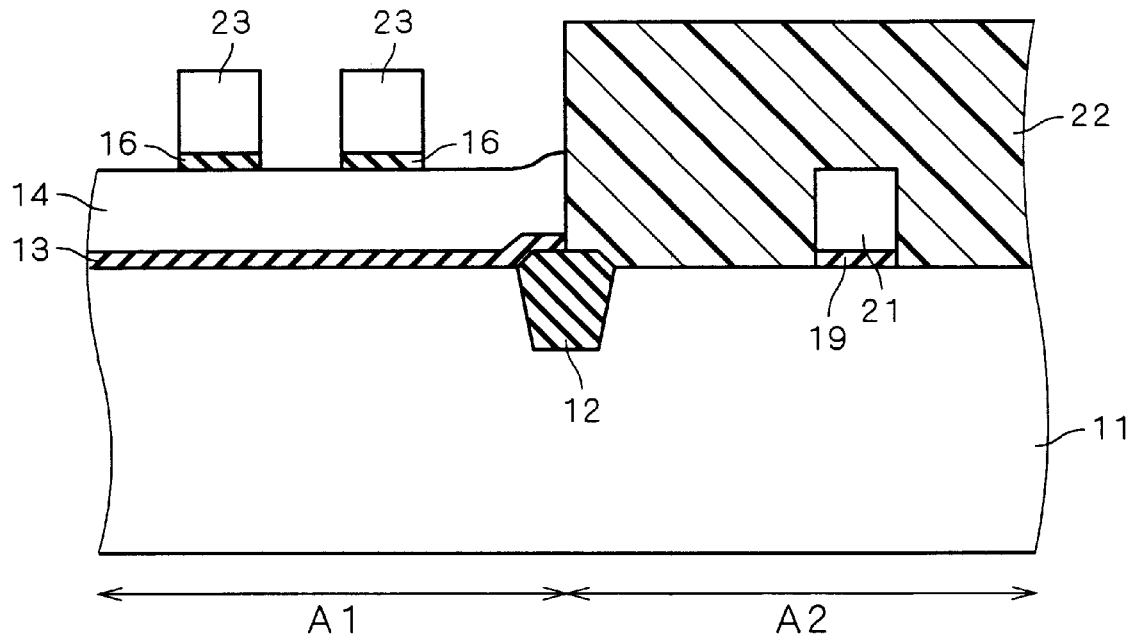

Using the resist 20 as a mask, etching is performed on the amorphous Si layer 18, the intergate oxide film 16 and the gate oxide film 19 to provide control gate electrodes 23 in the memory cell region A1 and a gate electrode 21 in the peripheral transistor region A2, as shown in FIG. 9.

Figure 8:
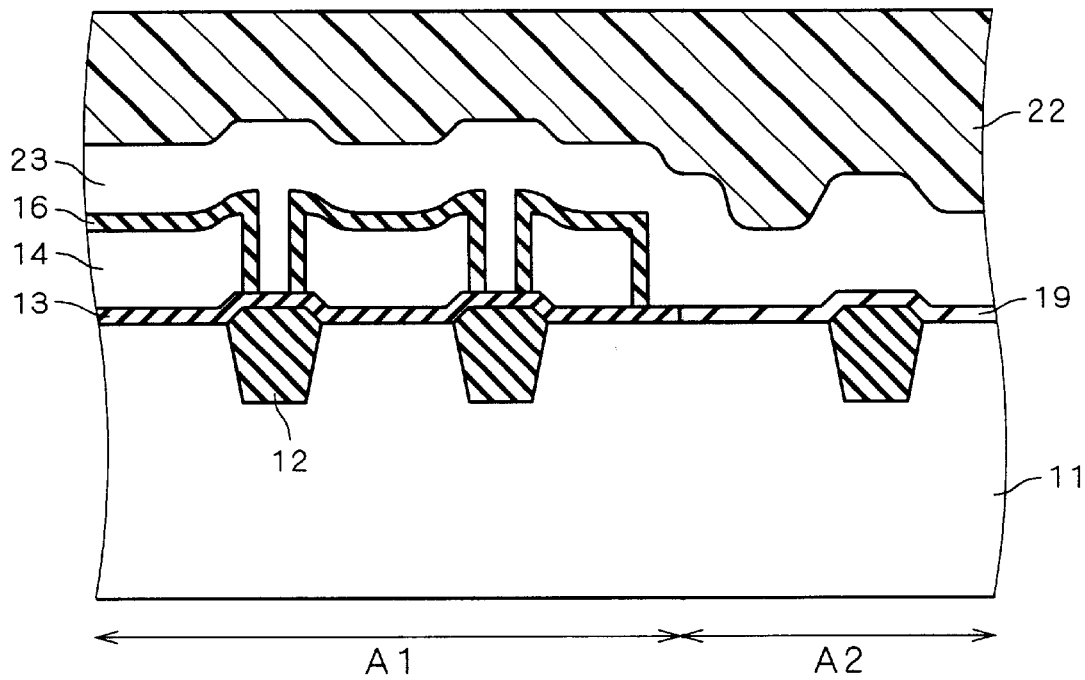
Figure 10:
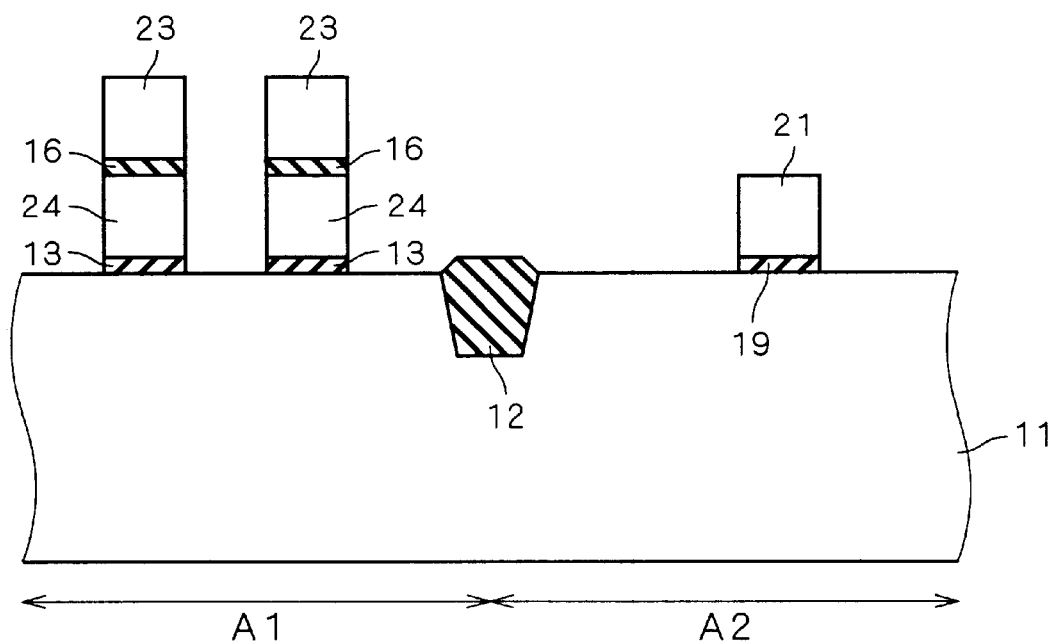

With reference to FIGS. 8 and 9, a resist 22 is formed which covers the memory cell region A1 and the peripheral transistor region A2 over the future word line region. Using the resist 22 and the control gate electrodes 23 as a mask, etching is performed on the amorphous Si layer 14 and the tunnel oxide film 13 to provide floating gate electrodes 24 which is equal in width in the direction of the bit line BL to the control gate electrodes 23, as shown in FIG. 10.

Figure 11:
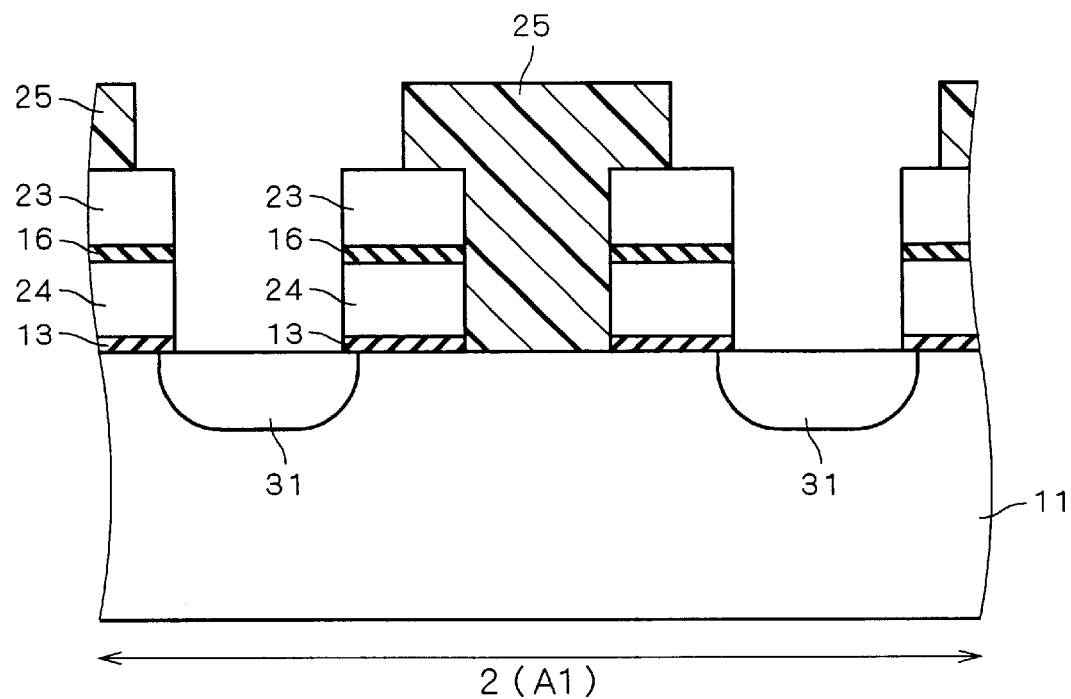

As shown in FIG. 11, arsenic (As) is introduced and diffused into the NOR-type flash memory region 2 of the memory cell region A1 in accordance with a first drain formation condition by using the control gate electrodes 23 and a resist 25 covering part of the control gate electrodes 23 and a future source region as a mask, to provide drain regions 31.

Figure 12:
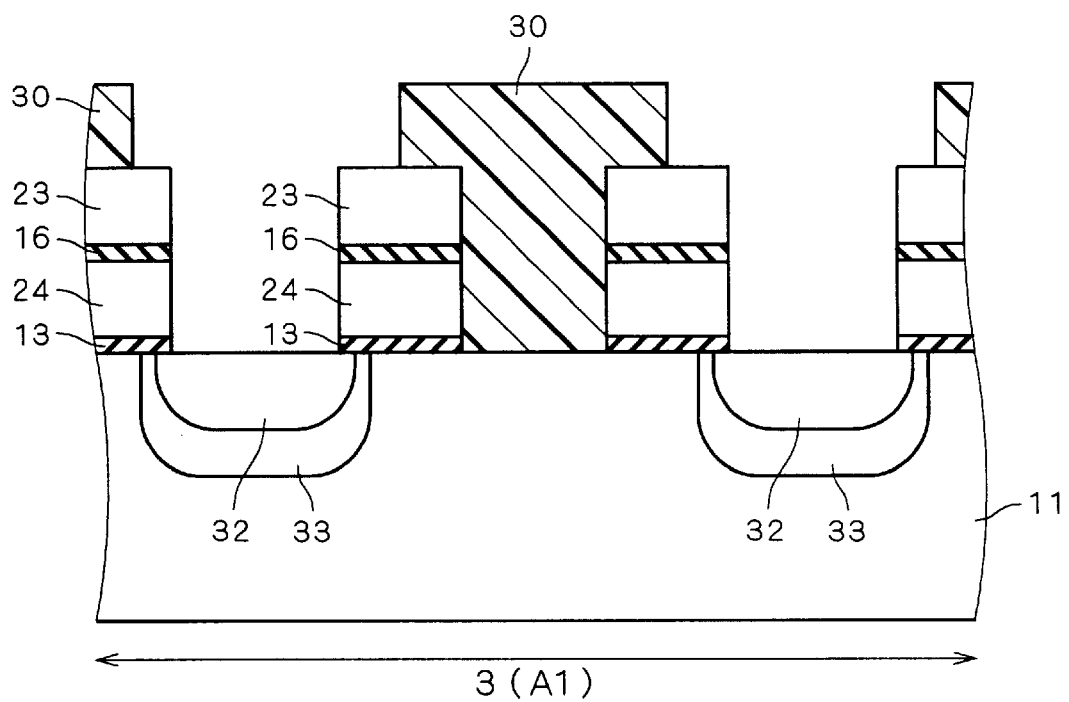

On the other hand, as shown in FIG. 12, arsenic is introduced and diffused into the DINOR-type flash memory region 3 of the memory cell region A1 in accordance with a first partial condition of a second drain formation condition by using the control gate electrodes 23 and a resist 30 covering part of the control gate electrodes 23 and a future source region as a mask, to provide drain main regions 32. Additionally, phosphorus (P) is introduced and diffused into the DINOR-type flash memory region 3 in accordance with a second partial condition of the second drain formation condition to provide drain diffusion regions 33 around the drain main regions 32.

The first drain formation condition and the first partial condition of the second drain formation condition which are the conditions of arsenic introduction for the NOR-type and DINOR-type flash memory regions 2 and 3, respectively, may be established identically as a partially common drain-formation condition. This allows the drain regions 31 and the drain main regions 32 to be formed simultaneously using the same resist to simplify the manufacturing steps, thereby reducing manufacturing costs.

FIG. 13 is a plan view showing a layout of the NOR-type flash memory region 2 after the completion of the step shown in FIG. 11. A section taken along the line A—A of FIG. 13 corresponds to the section taken along the word line WL (or the control gate electrode 23), and a section taken along the line B—B of FIG. 13 corresponds to the section taken along the bit line BL parallel to a direction in which the isolation films 12 extend. A section taken along the line C—C of FIG. 13 corresponds to the section taken along the region extending between the word lines WL. The shaded region of FIG. 13 corresponds to a source and a source connection region.

Figure 15:
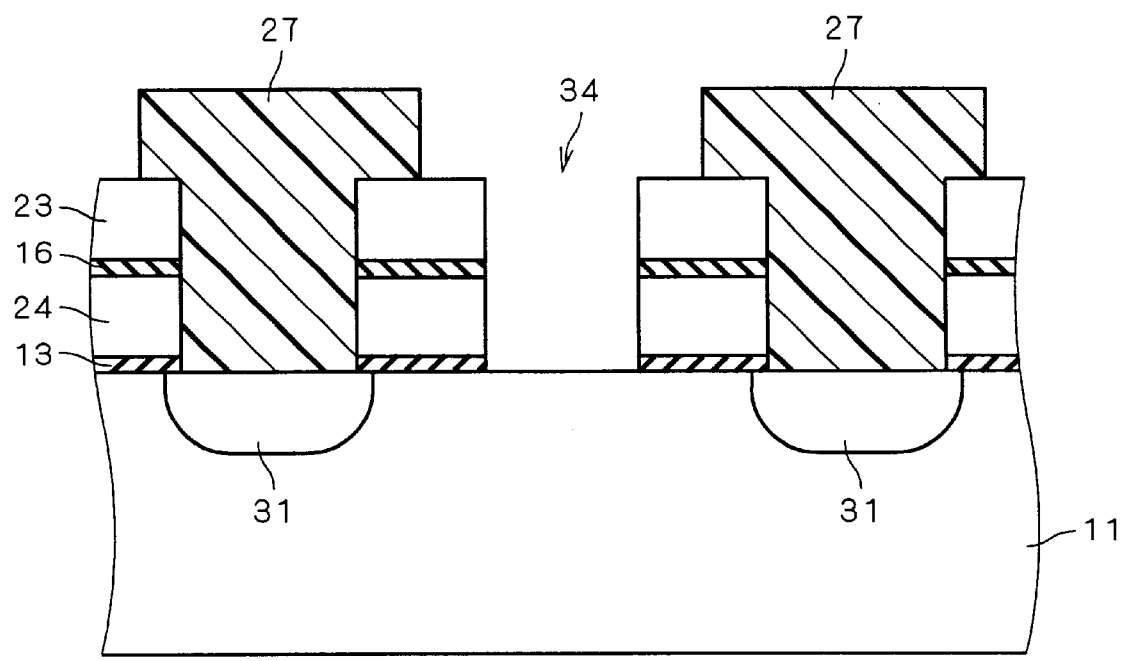
Figure 16:
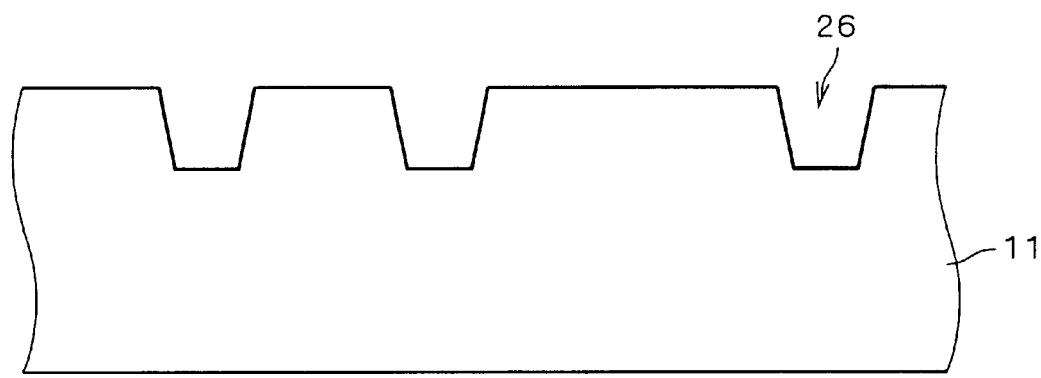
Figure 17:
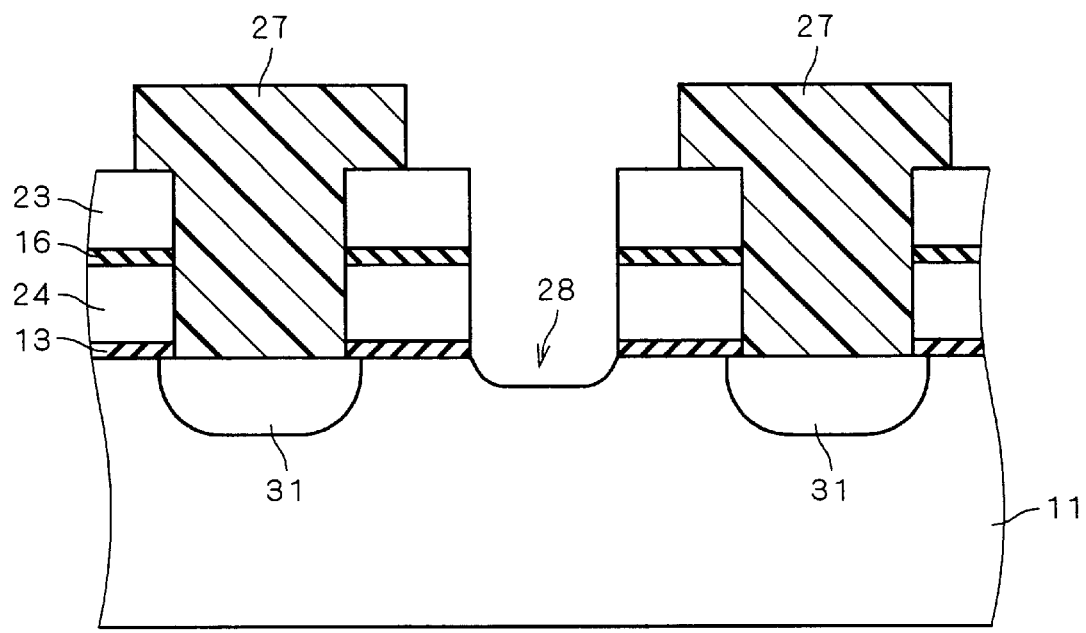

As shown in FIGS. 14 and 15 showing the sections taken along the lines C—C and B—B, respectively, of FIG. 13, a resist 27 having an opening 34 only over the source connection region is formed. An etching process is performed on the isolation films 12 using the resist 27 and the control gate electrodes 23 as a mask to selectively remove the isolation films 12, as shown in FIGS. 16 and 17. This process slightly removes the surface of the semiconductor substrate 11 under the opening 34 to form a shallow recess 28.

Figure 18:
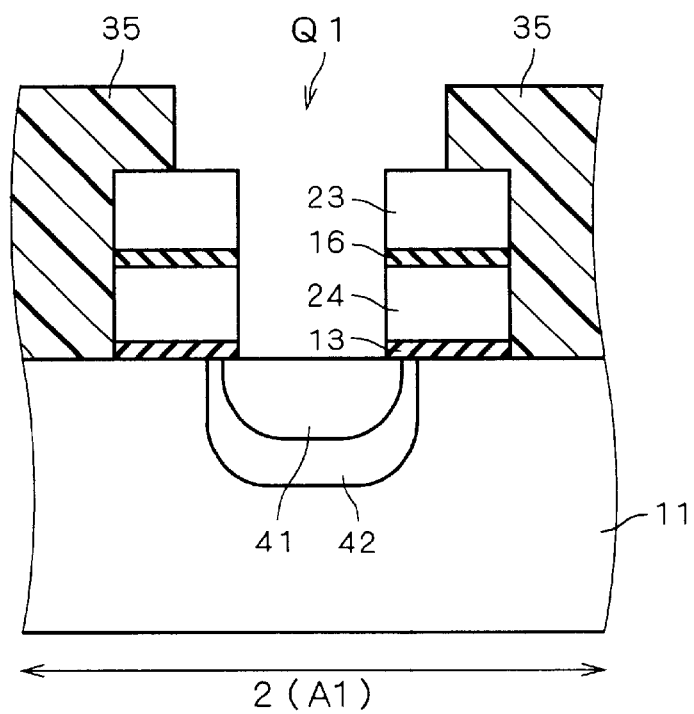

Next, as shown in FIG. 18, arsenic is introduced and diffused into the NOR-type flash memory region 2 of the memory cell region A1 in accordance with a first partial condition of a first source formation condition by using the control gate electrodes 23 and a resist 35 covering part of the control gate electrodes 23 and the drain region as a mask, to provide a source main region 41. Additionally, phosphorus is introduced and diffused into the NOR-type flash memory region 2 in accordance with a second partial condition of the first source formation condition to provide a source diffusion region 42 around the source main region 41. As a result, a NOR-type memory cell MOS transistor Q1 is completed. The source diffusion region 42 functions as an electric field relief region.

Figure 19:
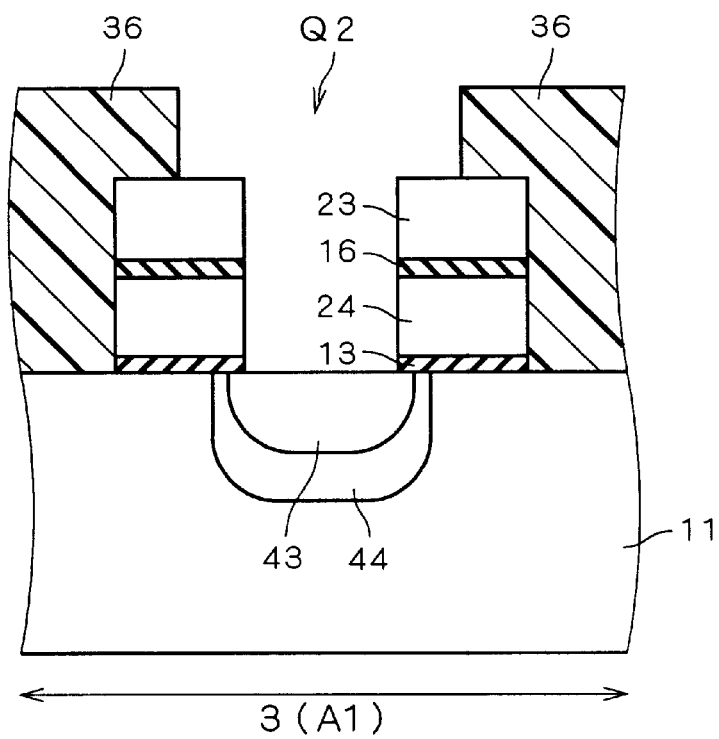

On the other hand, as shown in FIG. 19, arsenic is introduced and diffused into the DINOR-type flash memory region 3 of the memory cell region A1 in accordance with a second source formation condition by using the control gate electrodes 23 and a resist 36 covering part of the control gate electrodes 23 and the drain region as a mask, to provide a source region 43. As a result, a DINOR-type memory cell MOS transistor Q2 is completed.

Then, the step of introducing and diffusing boron more deeply than the arsenic into the DINOR-type flash memory region 3 to provide a P-type diffusion region 44 may be added as the second sourced formation condition. The P-type diffusion region 44 functions as a stopper against punch-through.

Thereafter, an existing interconnection step is performed. Then, a memory cell array of NOR-type memory cell MOS transistors Q1 is formed in the NOR-type flash memory region 2 of the memory cell region A1 whereas a memory cell array of DINOR-type memory cell MOS transistors Q2 is formed in the DINOR-type flash memory region 3 of the memory cell region A1. The source and drain regions of peripheral circuit transistors shared between the NOR-type flash memory region 2 and the DINOR-type flash memory region 3 are formed in the peripheral transistor region A2. Thus, the flash memory according to the first preferred embodiment is completed.

The flash memory according to the first preferred embodiment is provided with two types of flash memory regions (i.e., the NOR-type flash memory region 2 and the DINOR-type flash memory region 3) having different characteristics on the single chip. This provides the non-volatile semiconductor memory device usable in wide applications by using the DINOR-type memory cell transistor formed in the DINOR-type flash memory region 3 for low voltage random access applications and by using the NOR-type memory cell transistor formed in the NOR-type flash memory region 2 for applications requiring a high-speed operation.

The technique of forming the NOR-type flash memory region 2 and the DINOR-type flash memory region 3 on the single semiconductor chip 1 ensures a higher level of integration, as compared with the technique of forming the NOR-type and DINOR-type memory cell arrays on two individual chips.

Additionally, sharing the peripheral circuit region 7 between the NOR-type flash memory region 2 and the DINOR-type flash memory region 3 produces the effect of reducing a chip size because of the reduction in circuit area. This effect is not obtained by the formation of the NOR-type and DINOR-type memory cell arrays on two individual chips, and is quite important in the field of portable phones or the like in which there is a high demand for size reduction.

The process steps except the steps of forming the source and drain regions are shared between the manufacturing steps of the NOR-type and DINOR-type memory cell transistors. This minimizes the increase in the number of manufacturing steps for the formation of two types of memory cell transistors to effectively suppress the increase in manufacturing costs.

<Second Preferred Embodiment>

Figure 20:
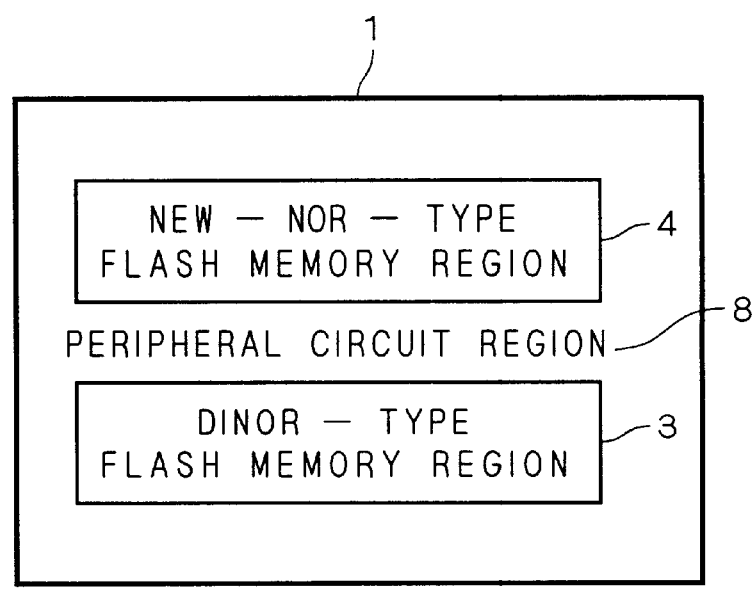
FIG. 20 illustrates a construction of a flash memory according to a second preferred embodiment of the present invention.

FIG. 20 illustrates a construction of a flash memory according to a second preferred embodiment of the present invention. As shown in FIG. 20, the DINOR-type flash memory region 3 and a new-NOR-type flash memory region 4 are manufactured into the semiconductor chip 1. A new-NOR-type memory cell transistor is formed in the new-NOR-type flash memory region 4, and a DINOR-type memory cell transistor is formed in the DINOR-type flash memory region 3.

A peripheral circuit region 8 is manufactured into a region surrounding the new-NOR-type flash memory region 4 and the DINOR-type flash memory region 3. A transistor for a peripheral circuit or the like is formed in the peripheral circuit region 8, and is shareable between the new-NOR-type flash memory region 4 and the DINOR-type flash memory region 3 by electrical connection to both of the regions 4 and 3.

Elements such as (memory cell) transistors manufactured into each of the new-NOR-type flash memory region 4, the DINOR-type flash memory region 3 and the peripheral circuit region 8 are arranged in a regularly ordered array such as a gate array.

Figure 21:
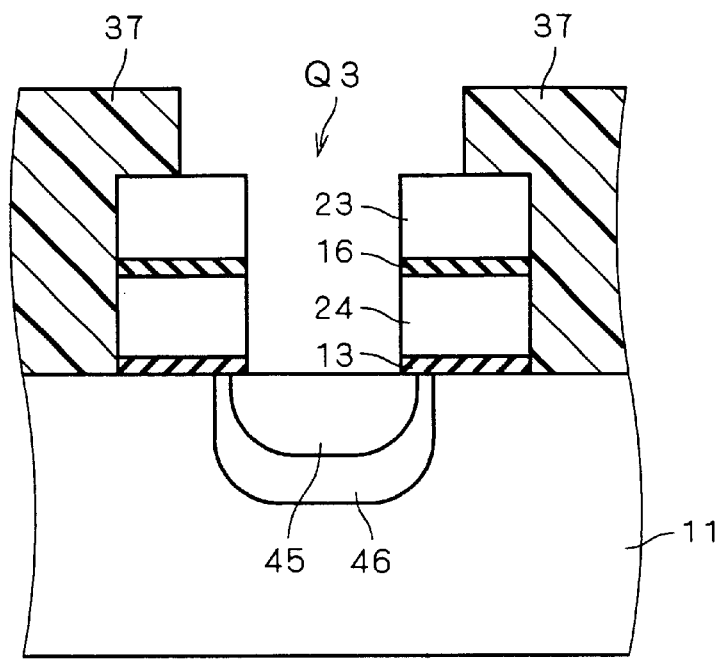
FIGS. 21 and 22 are sectional views showing the steps of forming source regions of memory cell transistors in the flash memory according to the second preferred embodiment.
Figure 22:
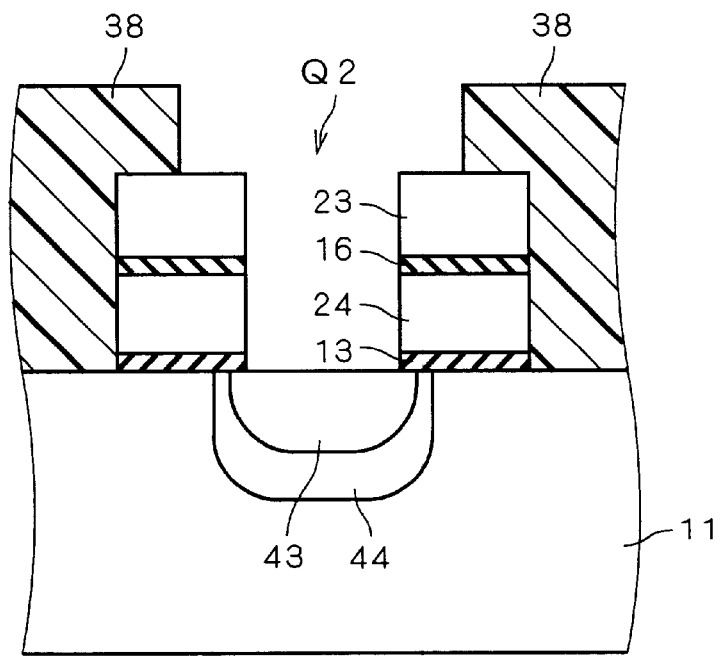

FIGS. 21 and 22 are sectional views showing the steps of forming the source region in a method of forming new-NOR-type and DINOR-type memory cell transistors in the flash memory according to the second preferred embodiment. FIGS. 21 and 22 are sectional views taken along the bit line BL.

The method of forming the memory cell transistors according to the second preferred embodiment before the step of forming the source region is identical with that of the first preferred embodiment shown in FIGS. 2 through 17, and only the step of forming the source region shown in FIGS. 21 and 22 will be described.

As shown in FIG. 21, arsenic is introduced and diffused into the new-NOR-type flash memory region 4 of the memory cell region A1 in accordance with the first source formation condition by using the control gate electrodes 23 and a resist 37 covering part of the control gate electrodes 23 and the drain region as a mask, to provide a source region 45. As a result, a new-NOR-type memory cell MOS transistor Q3 is completed.

On the other hand, as shown in FIG. 22, arsenic is introduced and diffused into the DINOR-type flash memory region 3 of the memory cell region A1 in accordance with the second source formation condition by using the control gate electrodes 23 and a resist 38 covering part of the control gate electrodes 23 and the drain region as a mask, to provide the source region 43. As a result, the DINOR-type memory cell MOS transistor Q2 is completed.

The new-NOR-type memory cell transistor and the DINOR-type memory cell transistor may be made completely identical in source profile. Thus, making the first and second source formation conditions identical with each other allows the simultaneous formation of the source region 43 and the source region 45 by using the same resist. As a result, making the step of forming the source regions entirely common simplifies the manufacturing steps to greatly reduce the manufacturing costs.

Then, the step of introducing and diffusing boron more deeply than the arsenic into the new-NOR-type flash memory region 4 and the DINOR-type flash memory region 3 to simultaneously form P-type diffusion regions 44 and 46 may be added as the first and second source formation conditions. The P-type diffusion regions 44 and 46 function as a stopper against punch-through.

Thereafter, an existing interconnection step is performed. Thus, the flash memory according to the second preferred embodiment is completed, as in the first preferred embodiment.

The flash memory according to the second preferred embodiment is provided with two types of flash memory regions (i.e., the new-NOR-type flash memory region 4 and the DINOR-type flash memory region 3) having different characteristics on the single chip. This provides the non-volatile semiconductor memory device usable in wide applications, as in the first preferred embodiment.

The flash memory according to the second preferred embodiment, like the first preferred embodiment, has the new-NOR-type flash memory region 4 and the DINOR-type flash memory region 3 on the single semiconductor chip 1, to produce the effect of reducing the chip size.

The process steps except the steps of forming the source and drain regions are shared between the manufacturing steps of the new-NOR-type and DINOR-type memory cell transistors. This effectively suppresses the increase in manufacturing costs, as in the first preferred embodiment.

Additionally, the second preferred embodiment uses the common step of forming the source regions to suppress the increase in manufacturing costs more effectively than the first preferred embodiment.

<Third Preferred Embodiment>

Figure 23:
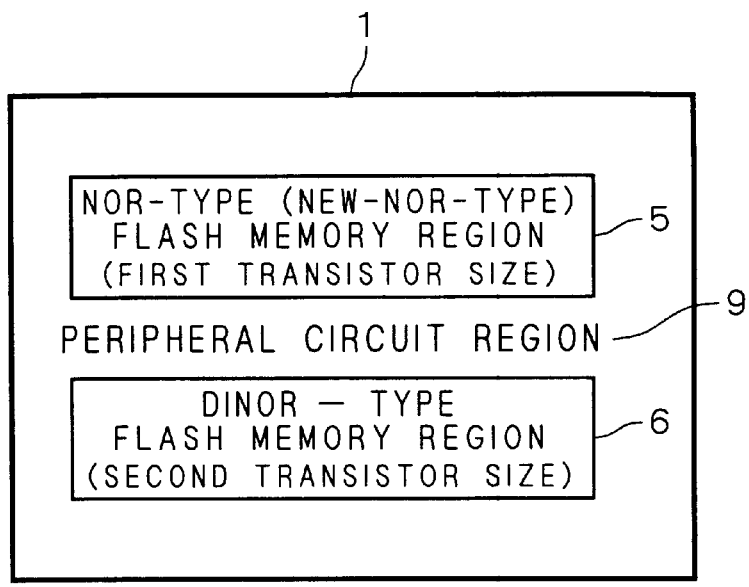
FIG. 23 illustrates a construction of a flash memory according to a third preferred embodiment of the present invention.
Figure 24:
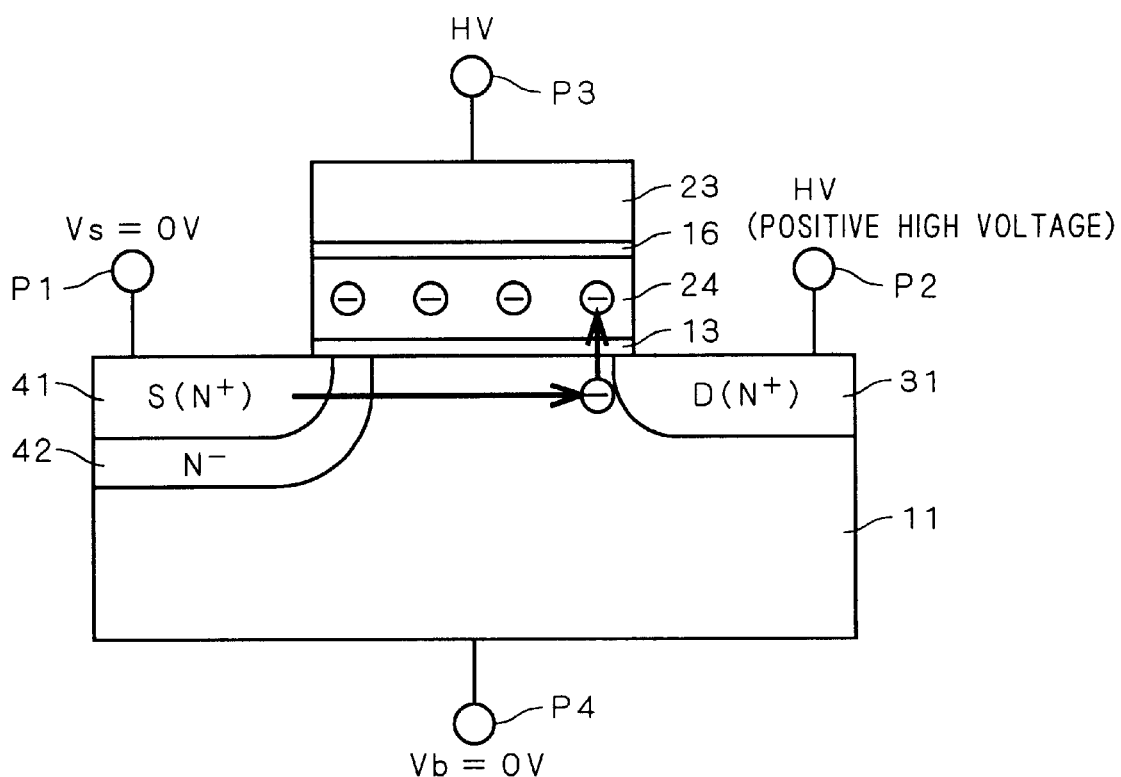
FIG. 24 illustrates a method of writing a NOR-type memory cell MOS transistor.
Figure 25:
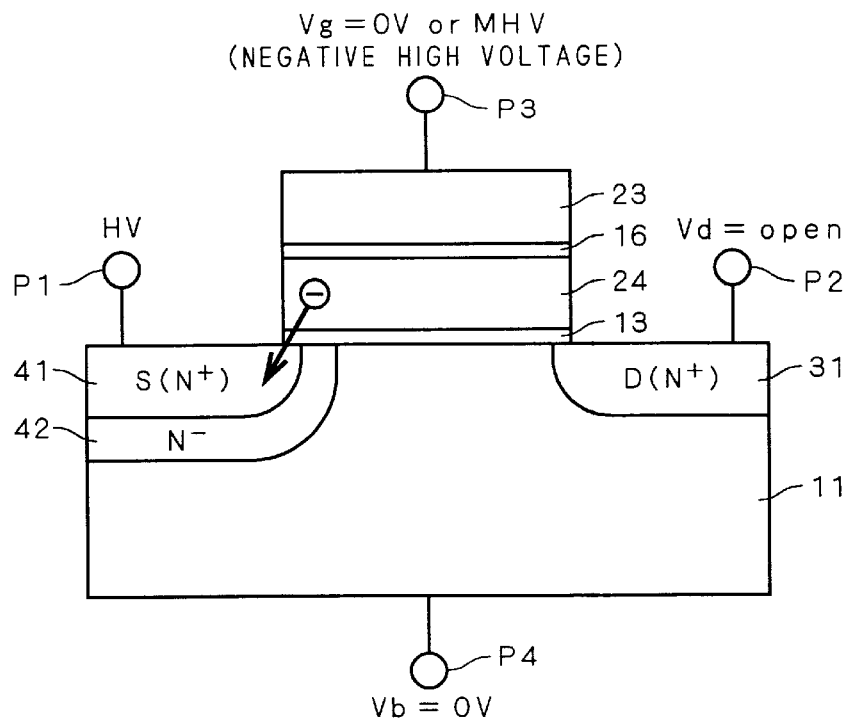
FIG. 25 illustrates a method of erasing the NOR-type memory cell MOS transistor.
Figure 26:
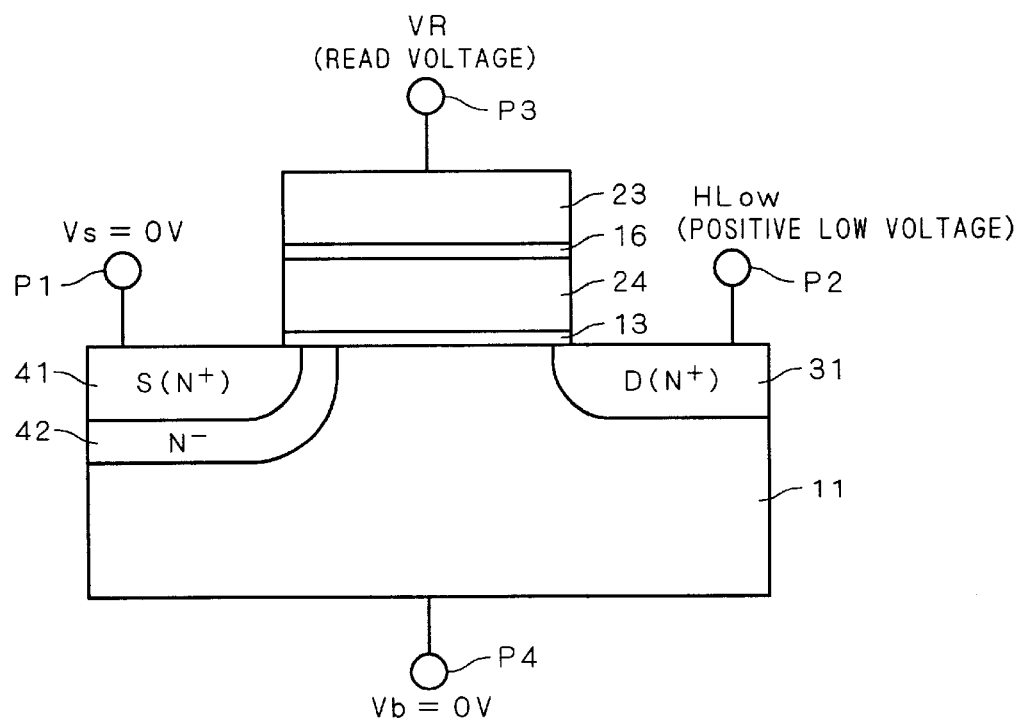
FIG. 26 illustrates a method of reading the NOR-type memory cell MOS transistor.
Figure 27:
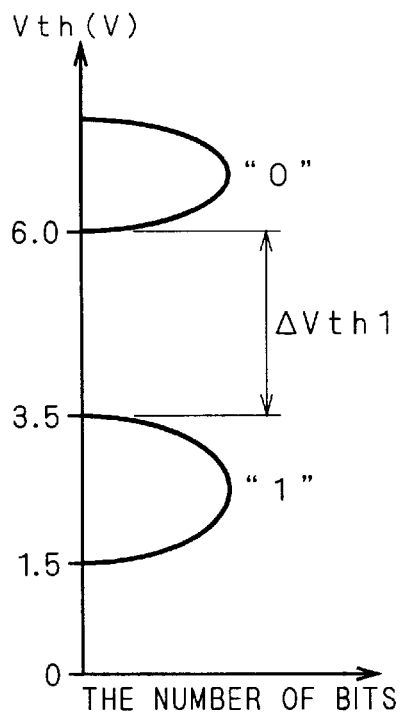
FIG. 27 is a graph showing a distribution of the threshold voltage of the NOR-type memory cell MOS transistor.
Figure 28:
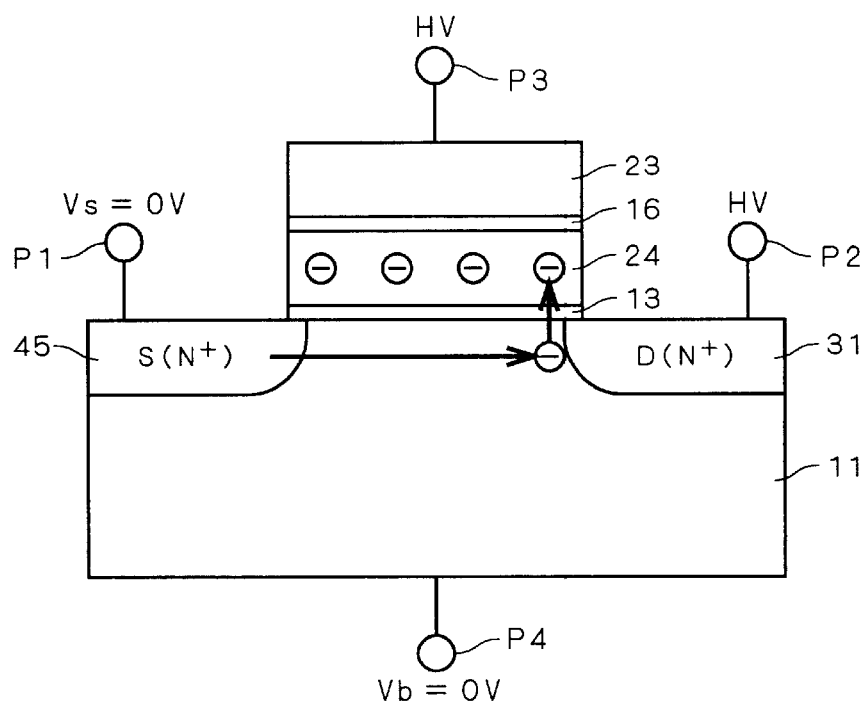
FIG. 28 illustrates a method of writing a new-NOR-type memory cell MOS transistor.
Figure 29:
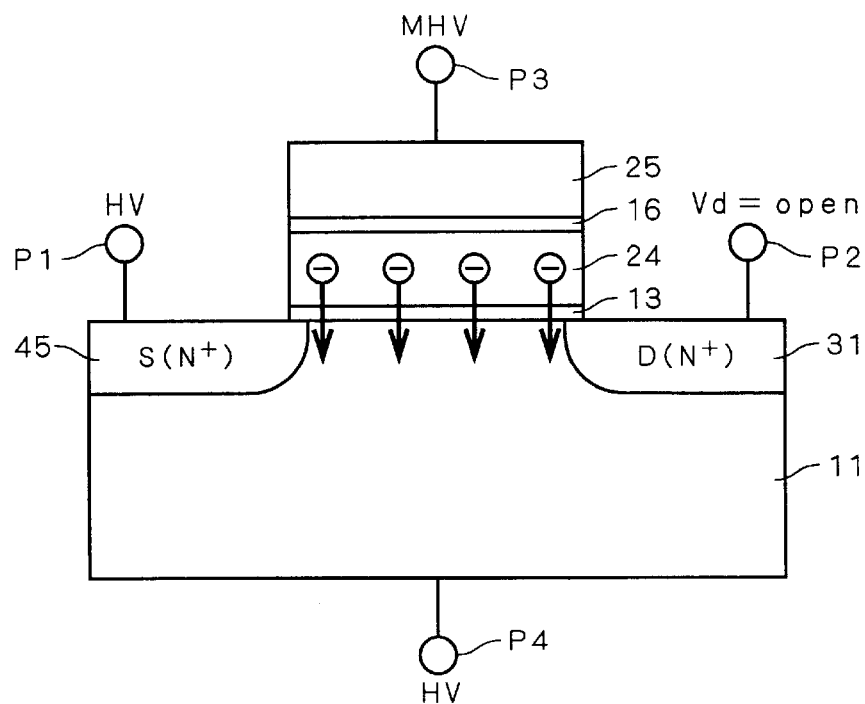
FIG. 29 illustrates a method of erasing the new-NOR-type memory cell MOS transistor.
Figure 30:
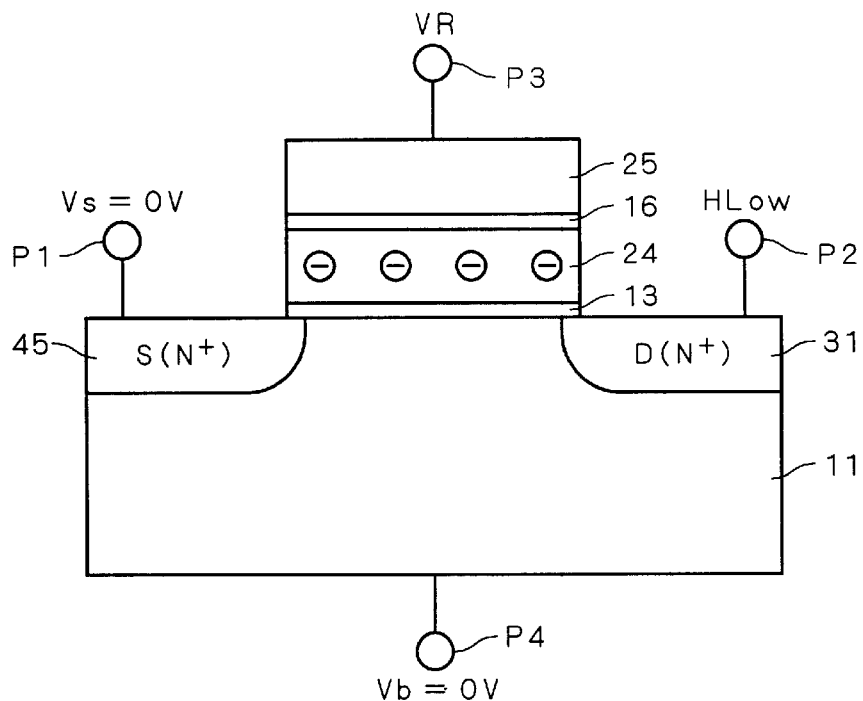
FIG. 30 illustrates a method of reading the new-NOR-type memory cell MOS transistor.
Figure 31:
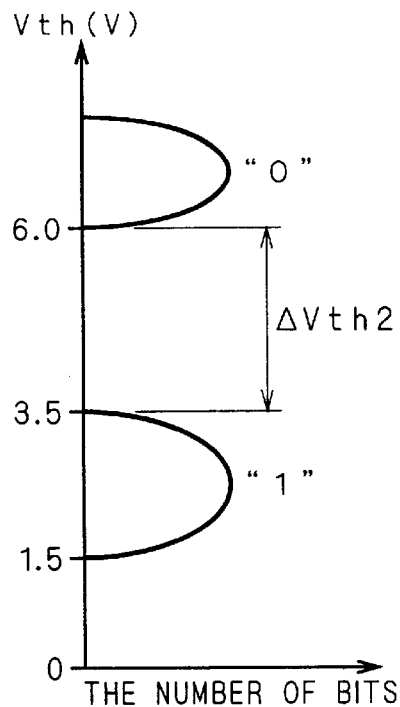
FIG. 31 is a graph showing a distribution of the threshold voltage of the new-NOR-type memory cell MOS transistor.
Figure 32:
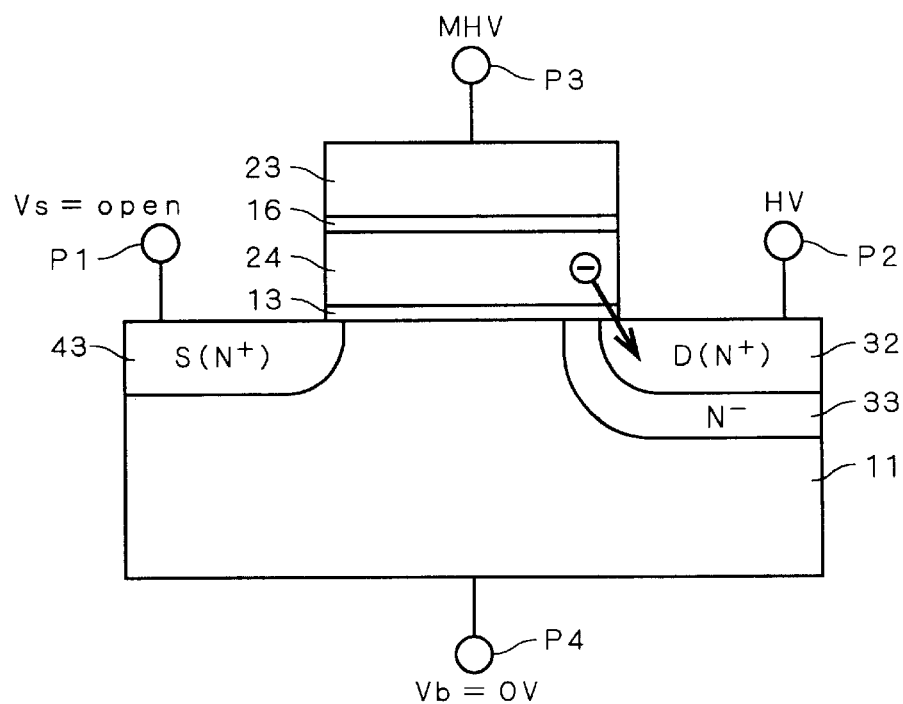
FIG. 32 illustrates a method of writing a DINOR-type memory cell MOS transistor.
Figure 33:
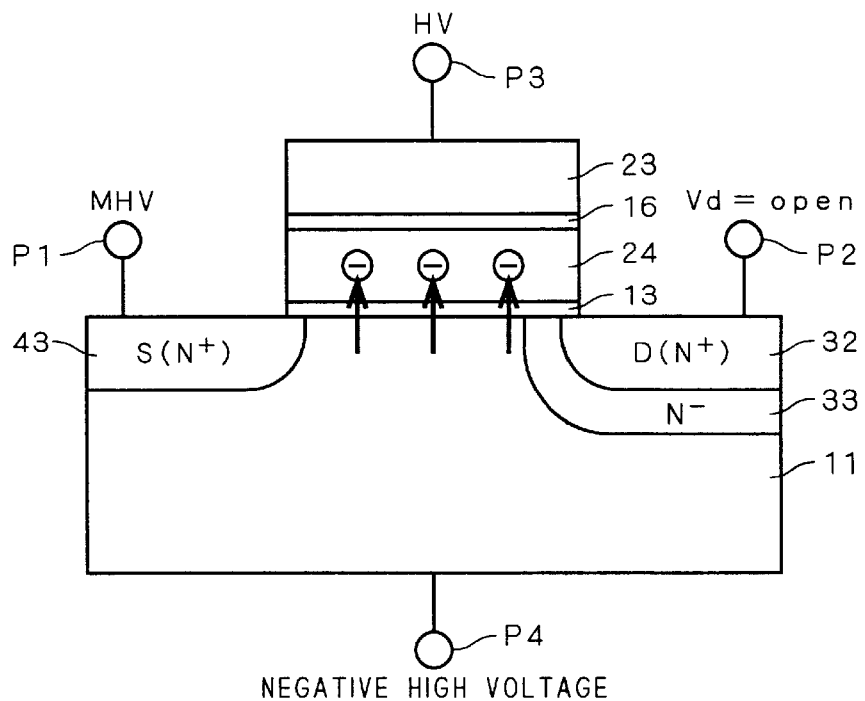
FIG. 33 illustrates a method of erasing the DINOR-type memory cell MOS transistor.
Figure 34:
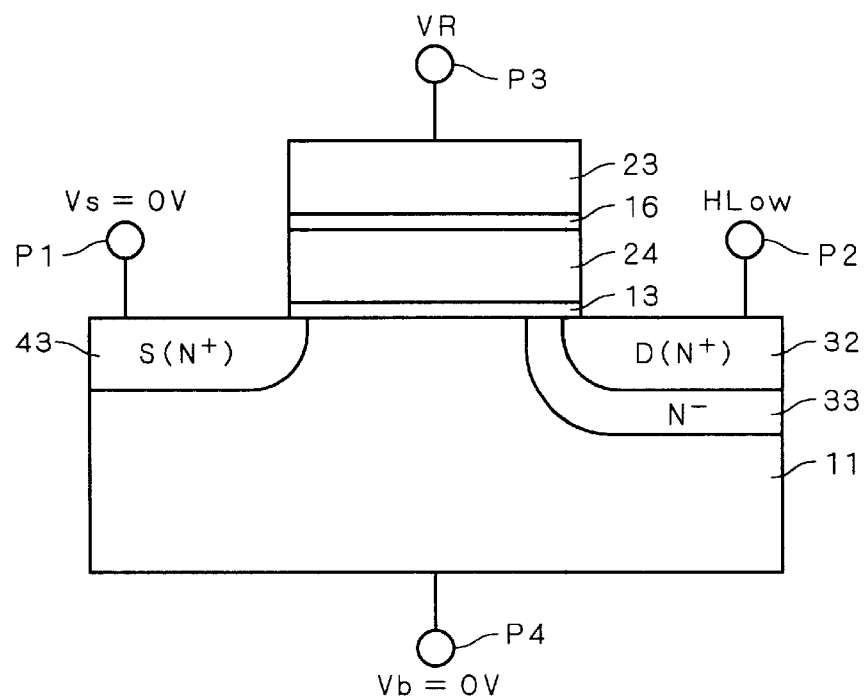
FIG. 34 illustrates a method of reading the DINOR-type memory cell MOS transistor.
Figure 37:
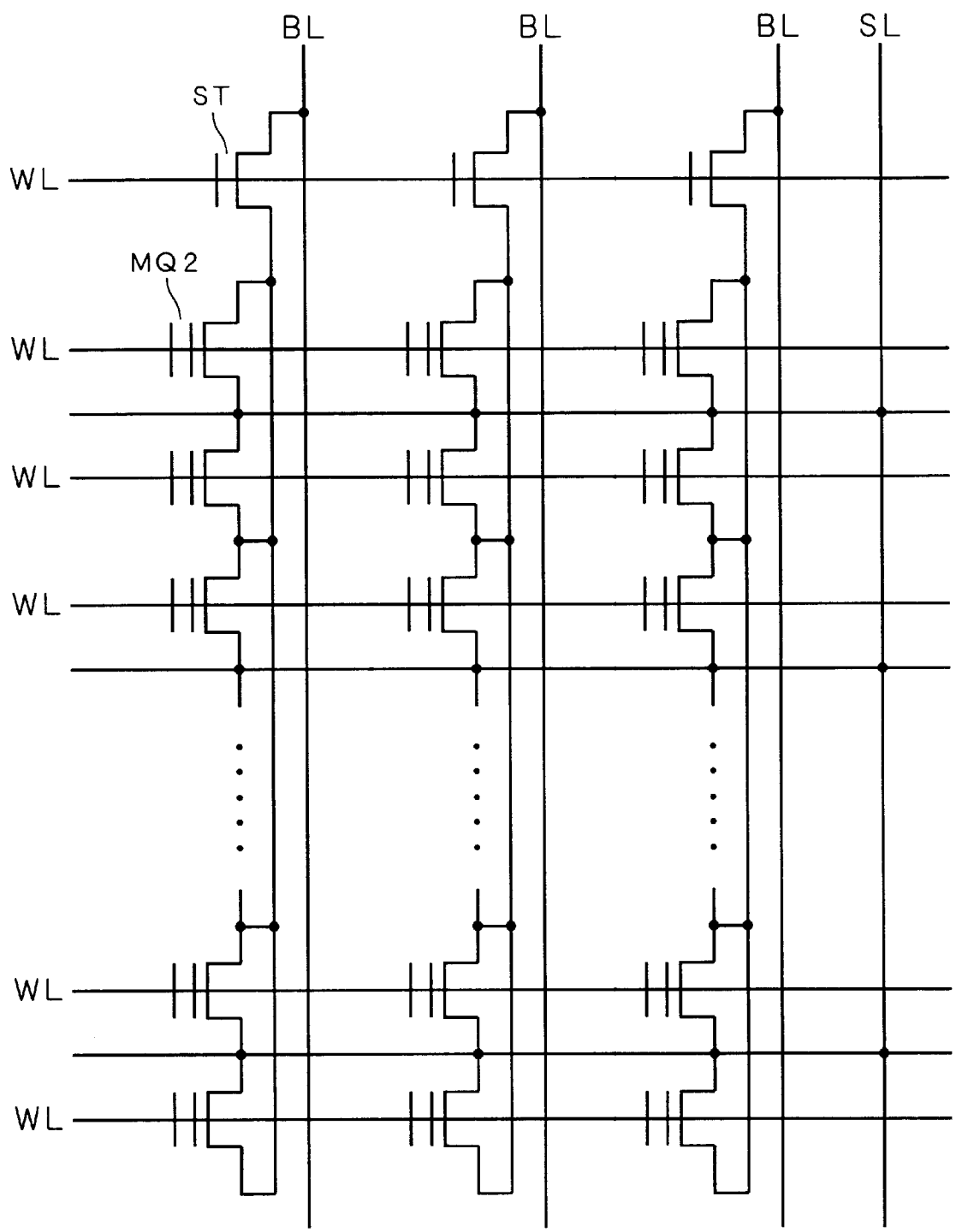
FIG. 37 is a circuit diagram showing an arrangement of a memory cell array of a DINOR-type flash memory.

FIG. 23 illustrates a construction of a flash memory according to a third preferred embodiment of the present invention. As shown in FIG. 23, a NOR-type flash memory region 5 and a DINOR-type flash memory region 6 are manufactured into the semiconductor chip 1. A NOR-type memory cell transistor having a first transistor size (cell size) is formed in the NOR-type flash memory region 5, and a DINOR-type memory cell transistor having a second transistor size is formed in the DINOR-type flash memory region 6.

A peripheral circuit region 9 is manufactured into a region surrounding the NOR-type flash memory region 5 and the DINOR-type flash memory region 6 A transistor for a peripheral circuit or the like is formed in the peripheral circuit region 9, and is shareable between the NOR-type flash memory region 5 and the DINOR-type flash memory region 6 by electrical connection to both of the regions 5 and 6.

Elements such as (memory cell) transistors manufactured into each of the NOR-type flash memory region 5, the DINOR-type flash memory region 6 and the peripheral circuit region 9 are arranged in a regularly ordered array such as a gate array.

In the flash memory according to the third preferred embodiment, the first transistor size of the NOR-type memory cell transistor formed in the NOR-type flash memory region 5 is greater than the second transistor size of the DINOR-type memory cell transistor formed in the DINOR-type flash memory region 6.

The flash memory according to the third preferred embodiment is provided with two types of flash memory regions (i.e., the DINOR-type flash memory region 6 and the NOR-type flash memory region 5) having different characteristics on the single chip. This provides the non-volatile semiconductor memory device usable in wide applications, as in the first preferred embodiment.

Additionally, the NOR-type memory cell transistor is greater in transistor size than the DINOR-type memory cell transistor. This provides the flash memory suitable for wider applications by changing a driving capability and the like.

The flash memory according to the third preferred embodiment, like the first and second preferred embodiments, has the DINOR-type flash memory region 6 and the NOR-type flash memory region 5 on the single semiconductor chip 1, to produce the effect of reducing the chip size.

The process steps except the steps of forming the source and drain regions are shared between the manufacturing steps of the NOR-type and DINOR-type memory cell transistors. This effectively suppresses the increase in manufacturing costs, as in the first preferred embodiment.

Although the transistor size of the NOR-type memory cell transistor is greater than that of the DINOR-type memory cell transistor in the third preferred embodiment, the transistor size of the DINOR-type memory cell transistor may, conversely, be greater than that of the NOR-type memory cell transistor. Further, a new-NOR-type flash memory region having a new-NOR-type memory cell transistor may be formed in place of the NOR-type flash memory cell region 5.

While the invention has been described in detail, the foregoing description is in all aspects illustrative and not restrictive. It is understood that numerous other modifications and variations can be devised without departing from the scope of the invention.

What is claimed is:

1. A non-volatile semiconductor memory device comprising:

a semiconductor substrate;

a first non-volatile memory cell region manufactured into said semiconductor substrate and capable of non-volatile storage, said first non-volatile memory cell region including a first memory cell transistor having a first operating characteristic in reading, writing and erase operations; and a second non-volatile memory cell region manufactured into said semiconductor substrate and capable of non-volatile storage, said second non-volatile memory cell region including a second memory cell transistor having a second operating characteristic different from said first operating characteristic in one of reading, writing and erase operations.

2. The non-volatile semiconductor memory device according to claim 1, further comprising a peripheral circuit region manufactured into said semiconductor substrate and including a peripheral circuit electrically connected to said first and second non-volatile memory cell regions, said peripheral circuit being shared between said first and second non-volatile memory cell regions.

3. The non-volatile semiconductor memory device according to claim 1, wherein said first memory cell transistor and said second memory cell transistor are different in transistor size from each other.

4. The non-volatile semiconductor memory device according to claim 1, wherein said first memory cell transistor includes a NOR-type memory cell transistor, and said second memory cell transistor includes a DINOR-type memory cell transistor.

5. The non-volatile semiconductor memory device according to claim 1, wherein the erase operation of said first memory cell transistor includes extracting an electron from a floating gate electrode constituting a memory cell into a surface of said semiconductor substrate serving as a channel region under said floating gate electrode.

6. The non-volatile semiconductor memory device according to claim 5, wherein a source region of said first memory cell transistor and a source region of said second memory cell transistor are identical in impurity profile with each other.

* * * * *